United States Patent
Lin et al.

(10) Patent No.: US 9,614,078 B1
(45) Date of Patent: Apr. 4, 2017

(54) METAL-OXIDE FIELD EFFECT TRANSISTOR HAVING AN OXIDE REGION WITHIN A LIGHTLY DOPED DRAIN REGION

(71) Applicant: VANGUARD INTERNATIONAL SEMICONDUCTOR CORPORATION, Hsinchu (TW)

(72) Inventors: Chih-Hung Lin, Taichung (TW); Chia-Hao Lee, New Taipei (TW); Chih-Cherng Liao, Jhudong Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/920,426

(22) Filed: Oct. 22, 2015

(51) Int. Cl.
| | |
|---|---|
| *H01L 29/78* | (2006.01) |
| *H01L 29/66* | (2006.01) |
| *H01L 21/02* | (2006.01) |
| *H01L 29/06* | (2006.01) |

(52) U.S. Cl.
CPC .... *H01L 29/7835* (2013.01); *H01L 21/02694* (2013.01); *H01L 29/0692* (2013.01); *H01L 29/6656* (2013.01); *H01L 29/66492* (2013.01)

(58) Field of Classification Search
CPC .............. H01L 29/7835; H01L 29/0692; H01L 29/66492; H01L 29/6656; H01L 21/02694
See application file for complete search history.

(56) References Cited

U.S. PATENT DOCUMENTS

| | | | |
|---|---|---|---|
| 5,382,533 A | 1/1995 | Ahmad et al. | |
| 5,599,726 A | 2/1997 | Pan | |
| 5,994,192 A | 11/1999 | Chen | |
| 6,399,987 B2 * | 6/2002 | Kim ...................... | H01L 21/743 257/340 |
| 2007/0267693 A1 | 11/2007 | Chien et al. | |
| 2008/0237631 A1 | 10/2008 | Watanabe | |
| 2008/0277734 A1* | 11/2008 | Bhattacharyya ....... | B82Y 10/00 257/369 |
| 2011/0024836 A1* | 2/2011 | Zinn ................... | H01L 29/0653 257/336 |
| 2013/0126893 A1* | 5/2013 | Tanaka ................ | H01L 29/2003 257/76 |

* cited by examiner

*Primary Examiner* — Charles Garber
*Assistant Examiner* — Brigitte Paterson
(74) *Attorney, Agent, or Firm* — Birch, Stewart, Kolasch & Birch, LLP (57) ABSTRACT

A semiconductor device and a method for manufacturing the same are provided. A semiconductor device includes a semiconductor substrate and a gate structure formed on the semiconductor substrate. A source region and a drain region are disposed on opposite sides of the gate structure on the semiconductor substrate. A lightly-doped drain region is adjacent to a side of the drain region close to the gate structure, and a lightly-doped source region is adjacent to a side of the source region close to the gate structure. An oxidation region is disposed in the lightly-doped drain region. A trench extends from the surface of the semiconductor substrate to the drain region. A source electrode is disposed on the source region, and the drain electrode has a first portion disposed on the drain region and a second portion disposed in the trench.

11 Claims, 6 Drawing Sheets

FIG. 10

METAL-OXIDE FIELD EFFECT TRANSISTOR HAVING AN OXIDE REGION WITHIN A LIGHTLY DOPED DRAIN REGION

BACKGROUND OF THE INVENTION

Field of the Invention

The invention relates to a semiconductor device and method for fabricating the same, and in particular to a semiconductor device with a metal-oxide-semiconductor field effect transistor and method for fabricating the same.

Description of the Related Art

In the semiconductor process of a metal-oxide-semiconductor field effect transistor (MOSFET), there are electrons in an electric field because they are attracted by the positive electric potential, and the electrons will gain kinetic energy and become accelerated. For example, when the channel length of the MOSFET decreases, if the applied voltage stays unchanged, the lateral electric field in the channel will increase. As a result, after being accelerated by the lateral electric field, the energy of the electrons will increase greatly. Because the energy of the electrons accelerated by the lateral electric field is greater than that of the electrons in a state of thermal equilibrium, the electrons with more energy may be regarded as hot carriers. Hot carriers may cause impact ionization, particularly in the region where the channel connects to the drain region. When the energy of the hot carriers is greater than the energy barrier between the channel and the gate dielectric layer (Si—$SiO_2$), the ionized electrons/holes impacted by the hot carriers may be injected into the gate electrode and cause a hot carrier injection (HCI) effect. While experiencing the HCI effect, the electrical properties of the device may be unstable, leading to the electrical properties of the device having a decreased reliability level.

In general, with conventional processing, the electric field of the region where the channel connects to the drain region is decreased by a lightly-doped drain being disposed so as to reduce the HCI effect. However, the HCI effect becomes worse as the driving current gets larger due to scaling-down of the size of transistor devices, and so a new method of processing is needed to reduce the HCI effect.

BRIEF SUMMARY OF THE INVENTION

An embodiment of the invention provides a semiconductor device, comprising a semiconductor substrate. A gate structure is disposed on the semiconductor substrate. A source region and a drain region are disposed on opposite sides of the gate structure on the semiconductor substrate. A lightly doped drain region is adjacent to a side of the drain region close to the gate structure. A lightly doped source region is adjacent to a side of the source region close to the gate structure. An oxide region is disposed in the lightly doped drain region. A trench extends from the surface of the semiconductor substrate into the drain region. A source electrode is disposed on the source region, and a drain electrode has a first portion disposed on the drain region and a second portion disposed in the trench.

An embodiment of the invention provides a method for fabricating a semiconductor device, the method comprising: providing a semiconductor substrate; forming a gate structure on the semiconductor substrate; forming a lightly doped source region and a lightly doped drain region on opposite sides of the gate structure on the semiconductor substrate; forming a source region and a drain region adjacent to the lightly doped source region and the lightly doped drain region, respectively; forming an oxide region in the lightly doped drain region; forming a trench extending from the surface of the semiconductor substrate into the drain region; forming a source electrode on the source region; and forming a drain electrode with a first portion disposed on the drain region and a second portion disposed in the trench.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The semiconductor device of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are merely for the purpose of illustration, and the inventive concept may be embodied in various forms without being limited to those exemplary embodiments. In addition, the drawings of different embodiments may use like and/or corresponding numerals to denote like and/or corresponding elements in order to clearly describe the present disclosure. However, the like and/or corresponding numerals in the drawings of different embodiments do not suggest any correlation between different embodiments. In addition, in this specification, expressions such as "first material layer disposed on/over a second material layer", may indicate not only the direct contact of the first material layer and the second material layer, but also, a non-contact state with one or more intermediate layers between the first material layer and the second material layer. In the above situation, the first material layer may not directly contact the second material layer.

In addition, in this specification, relative expressions are used. For example, "lower", "bottom", "higher" or "top" are used to describe the position of one element relative to another. It should be appreciated that if a device is flipped upside down, an element at a "lower" side will become an element at a "higher" side.

The terms "about" and "substantially" typically mean +/−20% of the stated value, more typically +/−10% of the stated value and even more typically +/−5% of the stated value. The stated value of the present disclosure is an approximate value. When there is no specific description, the stated value includes the meaning of "about" or "substantially".

Figure 1:
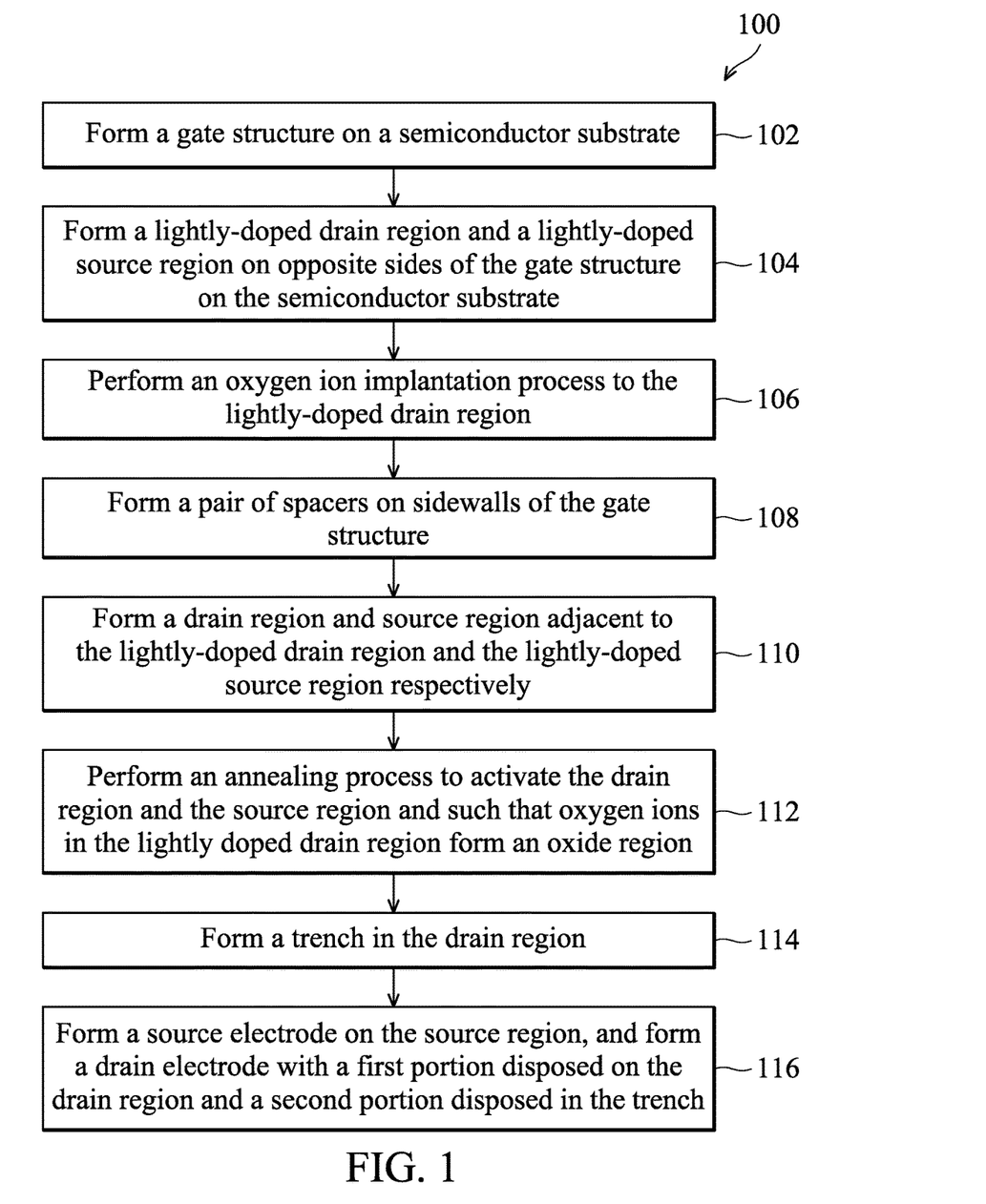
FIG. 1 illustrates a process flow diagram of fabricating a semiconductor device according to an exemplary embodiment of the invention.

Referring to the process flow diagram as shown in FIG. 1, and with reference to the cross-sectional views as shown in FIGS. 2-10 at the same time, FIG. 1 illustrates a formation method of a semiconductor device 200 according to some embodiments, and FIGS. 2-10 illustrate one or more structures formed in different intermediate process steps.

Figure 2:
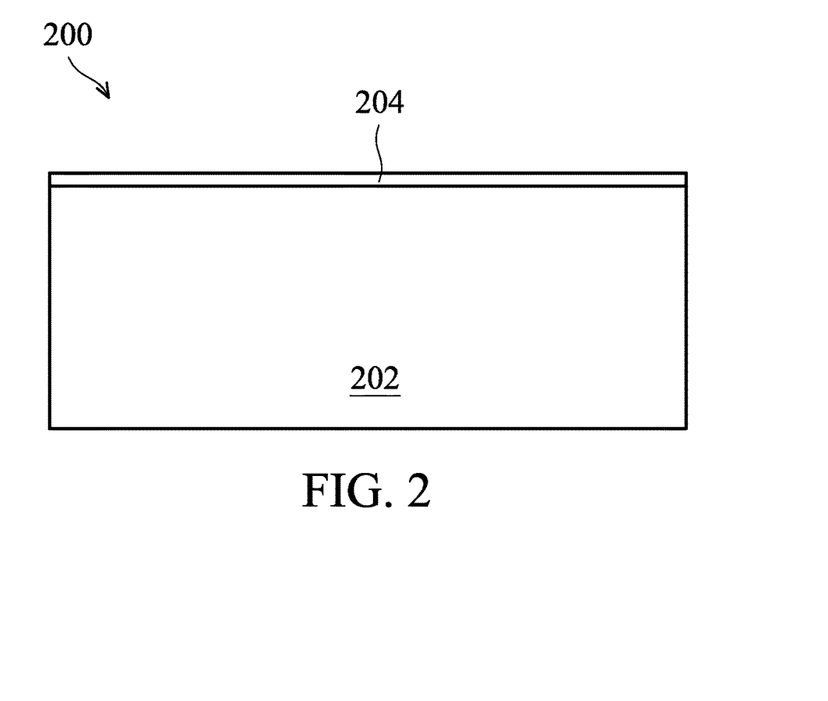
FIG. 2 illustrates a gate dielectric layer disposed on a semiconductor substrate according to an exemplary embodiment of the invention.

At 102, a gate dielectric layer 204 is formed on a semiconductor substrate 202, as shown in FIG. 2. According to some embodiments, the semiconductor substrate 202 includes at least one of an epitaxial layer, a bulk substrate, a silicon-on-insulator (SOI) structure, a wafer, and a die formed from a wafer. In an embodiment, the semiconductor substrate 202 is a p-type semiconductor substrate. In some embodiments, the gate dielectric layer 204 includes dielectric material such as silicon oxide, silicon oxynitride, high-k material, other suitable material, and/or a combination thereof. High-k materials include hafnium oxide, hafnium silicon oxide, hafnium silicon oxynitride, hafnium tantalum oxide, hafnium titanium oxide, hafnium zirconium oxide, zirconium oxide, aluminum oxide, hafnium oxide-aluminum oxide alloy, and/or combination thereof, or a similar material. The gate dielectric layer 204 may deposited by a low pressure chemical vapor deposition (LPCVD) process, a low temperature chemical vapor deposition (LTCVD) process, a rapid thermal chemical vapor deposition (RTCVD) process, a plasma enhanced chemical vapor deposition (PECVD) process, an atomic layer deposition (ALD) process, or another suitable method.

Figure 3:
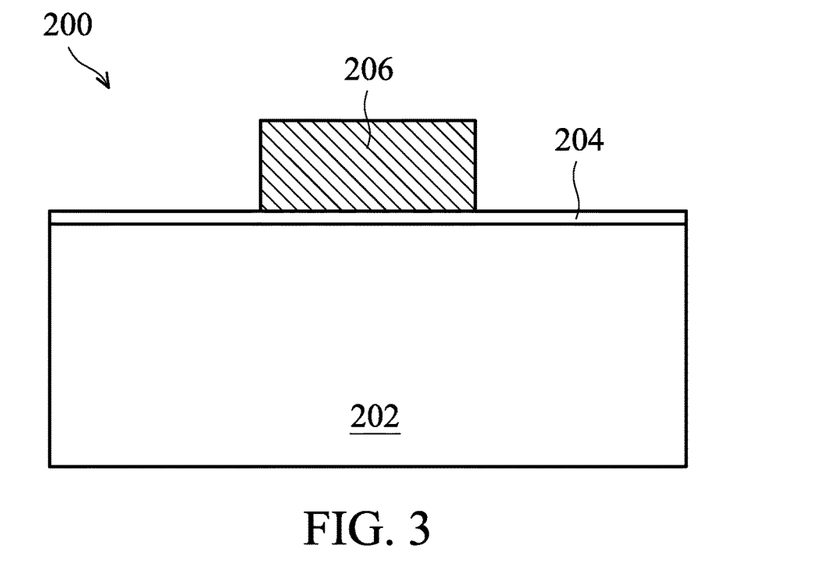
FIG. 3 illustrates a gate electrode disposed on the gate dielectric layer according to an exemplary embodiment of the invention.

At 104, a gate electrode layer is formed on the gate dielectric layer 204, wherein the gate electrode layer may include doped polysilicon, metal material and metal silicide. The material of the gate electrode layer may be formed by a CVD process, sputtering process, resistor thermal evaporation process, electron beam (EB) evaporation process, or another suitable deposition method. For example, in an embodiment, amorphous silicon conductive material or polysilicon conductive material is fabricated by an LPCVD process. Subsequently, the gate electrode layer is patterned to form a gate electrode 206 (which is not illustrated in FIG. 2 but is illustrated in FIG. 3). In some embodiments, a photoresist material is coated on the gate electrode layer, and then the photoresist material is defined by a desired pattern by a photolithography process. A developer is then applied to the exposed photoresist to take advantage of the physical changes and selectively remove either the exposed portion of the photoresist or the unexposed portion of the photoresist, depending upon the desired pattern, so as to expose a portion of the gate electrode layer. Then, the photoresist is used as an etching mask, and the exposed portion of the gate electrode layer is etched by an etching process until the gate dielectric layer 204 is exposed, as shown in FIG. 3. In some embodiments, the etching process may be a wet etching process, dry etching process, plasma etching process, reactive ion etching (RIE) process, or a similar process.

Subsequently, the photoresist on the gate electrode 206 is removed, in some embodiments, the photoresist may be removed utilizing, e.g., an ashing process, whereby the temperature of the photoresist is raised until the photoresist experiences a thermal decomposition and may be easily removed. However, any other suitable removal process may alternatively be utilized. Once the ashing process has been performed, the structure may be cleaned by a cleaning process in order to assist in the removal of the photoresist. In an embodiment, the cleaning process may include dipping the semiconductor device 200 into an etchant in order to ensure that any remaining portions of the photoresist are removed from the semiconductor device 200 prior to subsequent processing. For example, the semiconductor device 200 may be dipped into an etchant such as HF for between about 10 seconds and about 30 seconds, such as about 20 seconds.

Figure 4:
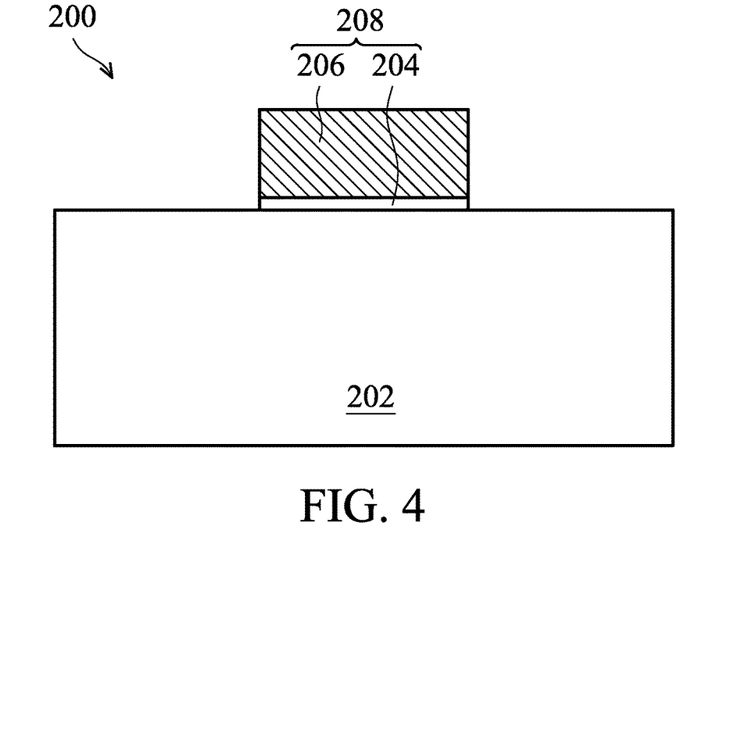
FIG. 4 illustrates etching a gate dielectric layer to form a gate structure according to an exemplary embodiment of the invention.

Then, the gate electrode 206 is used as an etching mask, and an etching process is performed to etch the exposed gate dielectric layer 204. In some embodiments, the etching process may be a wet etching process, dry etching process, plasma etching process, reactive ion etching (RIE) process, or a similar process. As a result, a patterned gate dielectric layer 204 and the gate electrode 206 disposed thereon are formed. The patterned gate dielectric layer 204 and the gate electrode 206 disposed thereon may be regarded as a gate structure 208, as shown in FIG. 4.

Figure 5:
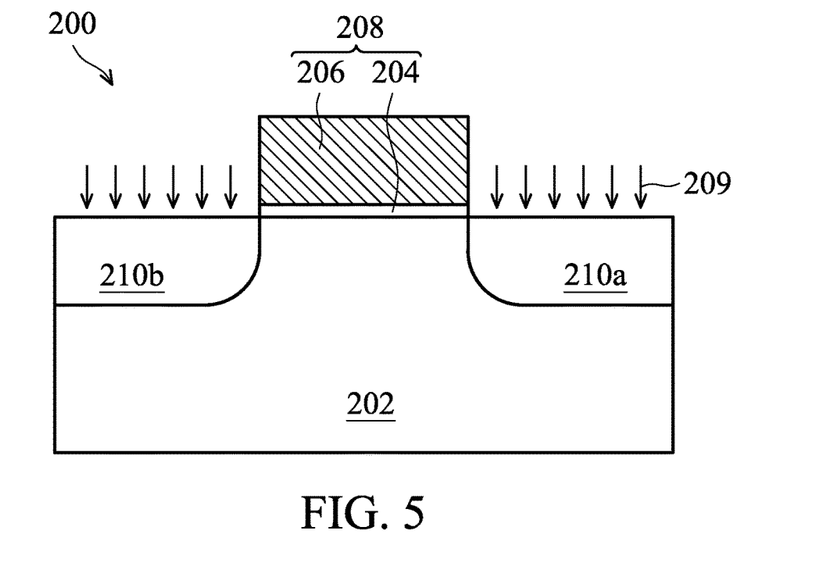
FIG. 5 illustrates a lightly-doped implantation process performed to form a lightly-doped source region and a lightly-doped drain region according to an exemplary embodiment of the invention.

At 104, a lightly-doped drain region 210a and a lightly-doped source region 210b are disposed on opposite sides of the gate structure on the semiconductor substrate, as shown in FIG. 5. In this embodiment, the gate structure 208 is used as mask, and a lightly-doped implantation process 209 is performed to form the lightly-doped drain region 210a and the lightly-doped source region 210b adjacent to two sides of the gate structure 208 respectively. In some embodiments, the dose of the lightly-doped implantation process 209 is between about $1 \times 10^{13}$ cm$^{-2}$ to $8 \times 10^{13}$ cm$^{-2}$. In some embodiments, phosphorus, arsenic, or a similar material may be utilized as the material in the lightly-doped implantation process 209. In this embodiment, after using the gate structure 208 as a mask and performing the lightly-doped implantation process 209, the lightly-doped drain region 210a and the lightly-doped source region 210b are formed in the semiconductor substrate and adjacent to two respective sides of the gate structure, as shown in FIG. 5.

Figure 6:
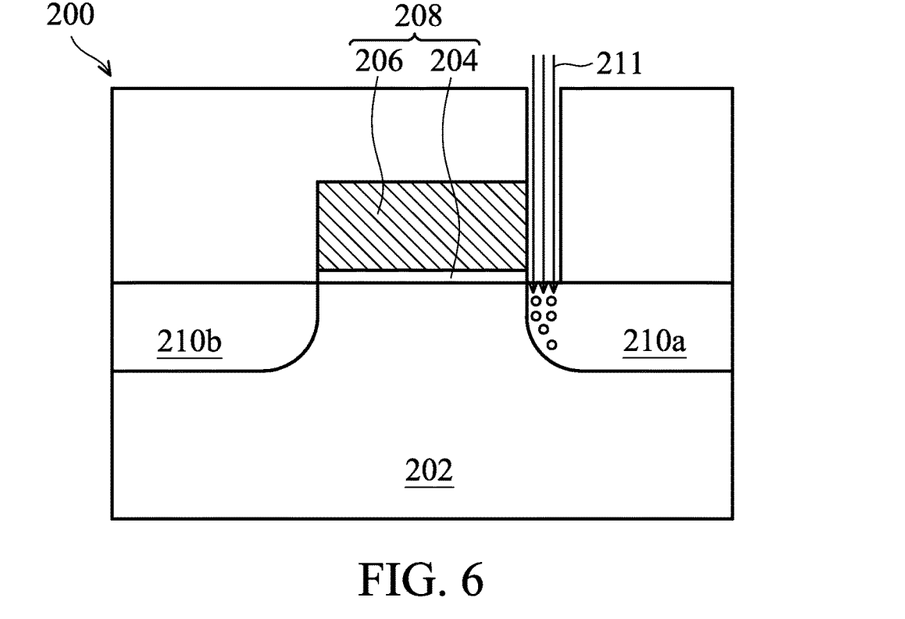
FIG. 6 illustrates an oxygen ion implantation process performed on the lightly-doped drain region according to an exemplary embodiment of the invention.

At 106, an oxygen ion implantation process 211 is performed on the lightly-doped drain region 210a, as shown in FIG. 5. In some embodiments, a photoresist (not illustrated) is coated onto the semiconductor device 200, and then a desired pattern is defined by a photolithography process. A developer is then applied to the exposed photoresist to take advantage of the physical changes and selectively remove either the exposed portion of the photoresist or the unexposed portion of the photoresist, depending upon the desired pattern, so as to form an opening to expose a portion of the lightly-doped drain region 210a. In this embodiment, the opening is on the lightly-doped drain region 210a and it approaches the gate structure 208. Then, the photoresist is used as a mask, and the oxygen ion implantation process 211 is performed. The oxygen ion implantation process 211 is an ion implantation process by using oxygen ions as an implantation material, and the oxygen ions are implanted into the lightly-doped drain region 210a as shown in FIG. 6, wherein the dose of the oxygen ion implantation process 211 is between about $1 \times 10^{18}$ cm$^{-2}$ and $5 \times 10^{18}$ cm$^{-2}$. Subsequently, an ashing process and a cleaning process are performed to remove the remaining photoresist on the semiconductor device 200. The ashing process and the cleaning process have the same meaning as in the preceding paragraph and will not be repeated for the sake of brevity.

Figure 7:
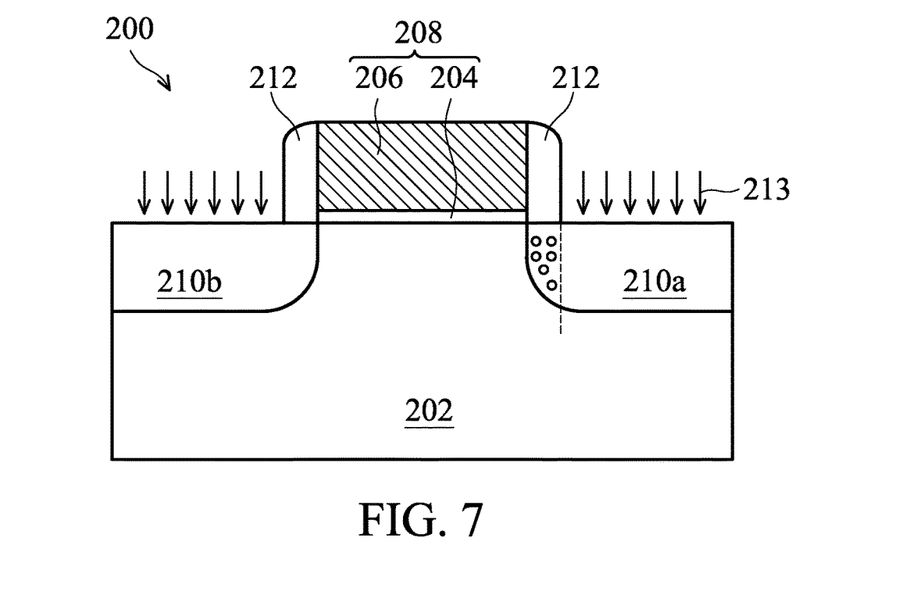
FIG. 7 illustrates a pair of disposed spacers performing a heavily-doped implantation process to form a source region and a drain region according to an exemplary embodiment of the invention.

At 108, a pair of spacers 212 is formed on sidewalls of the gate structure 208, as shown in FIG. 7. At first, an insulating layer (not illustrated) is conformally formed on the semiconductor device 200 covering the gate structure 208 and the semiconductor substrate 202. In some embodiments, the insulating layer may include silicon oxide, silicon nitride, a combination thereof, or a similar material. The insulating layer may be formed by LPCVD, LTCVD, rapid thermal CVD, PECVD, ALD, or another suitable method. Using the semiconductor substrate 202 as an etching stop layer, an isotropic etching process, such as plasma etching or RIE, is then performed on the insulating layer to form a pair of spacers 212, as shown in FIG. 7.

Figure 8:
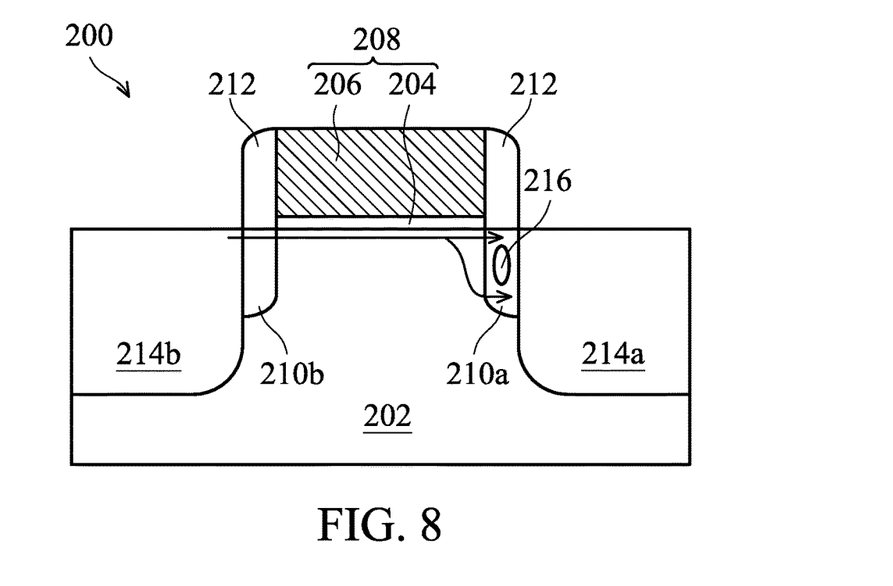
FIG. 8 illustrates an annealing process on the oxygen ions performed in the lightly-doped drain region to form an oxide region according to an exemplary embodiment of the invention.

At 110, a heavily doped implantation process 213 is performed on the semiconductor substrate 202, as shown in FIG. 7. Once the spacers 212 have been formed, the gate structure 208 and spacers 212 are used as a mask, and the heavily doped implantation process 213 is performed on the semiconductor substrate 202 at two sides of the gate structure 208 and the spacers 212 to form a drain region 214a and source region 214b. In this embodiment, the oxygen ion implantation process 211 is performed before the drain region 214a and the source region 214b are formed. In some embodiments, the dose of the heavily doped implantation process 213 is between about $1 \times 10^{14}$ cm$^{-2}$ to $5 \times 10^{15}$ cm$^{-2}$. In this embodiment, phosphorus, arsenic, or a similar material may be utilized as the material in the heavily doped implantation process 213. After the heavily doped implantation process 213 is performed, the drain region 214a and the source region 214b are formed in the semiconductor substrate 202, as shown in FIG. 8. In this embodiment, because the spacers 212 are used as a mask, the lightly-doped drain region 210a and the lightly-doped source region 210b beneath the pair of spacers 212 remain, without being doped by the heavily doped implantation process 213. After the heavily doped implantation process 213 is performed, the lightly-doped drain region 210a is adjacent to the formed drain region 214a, and the lightly-doped source region 210b is adjacent to the formed source region 214b.

At 112, an annealing process (not illustrated) is performed to activate the drain region 214a and the source region 214b and to let the oxygen ions form an oxide region, as shown in FIG. 8. In some embodiments, the annealing process is performed at a temperature between about 800° C. to 1000° C., and for between about 30 minutes to 2 hours. In another embodiment, a rapid thermal annealing process is performed at a temperature between about 900° C. to 1100° C., and for about 1 minute. Once the annealing process has been performed, the drain region 214a and the source region 214b are activated and an oxide region 216 is formed in the lightly-doped drain region 210a. In some embodiments, the oxide region 216 is correspondingly disposed beneath one of the spacers 212. In some embodiments, the oxide region 216 is fully enclosed by the lightly doped drain region 210a. Therefore, during the operation of the semiconductor device 200, the current flowing from the source region to the drain region may be bypassed while flowing past the oxide region 216 in the lightly-doped drain region 210a to decease the current density, in order to prevent the HCI effect. The bypassing direction of the current is labeled with the arrow shown in FIG. 8.

Figure 9:
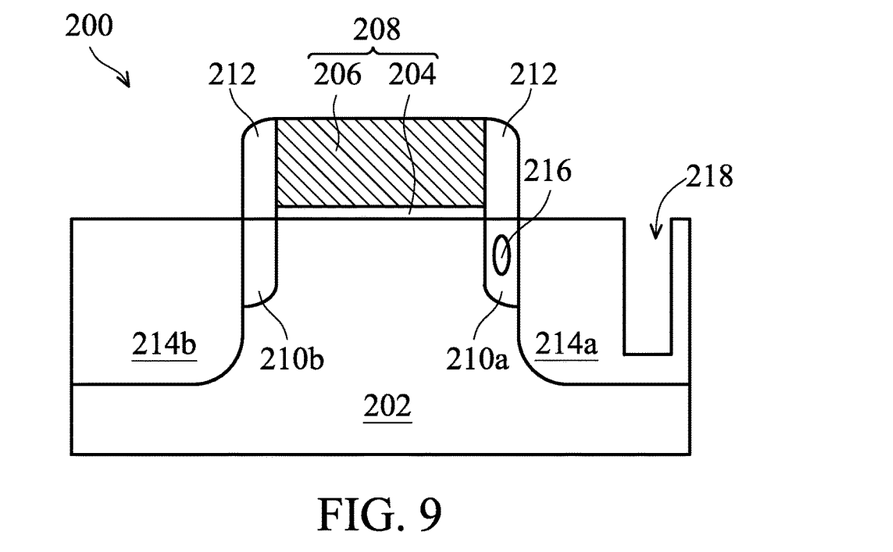
FIG. 9 illustrates a trench in the drain region formed according to an exemplary embodiment of the invention.

At 114, a trench 218 is formed from a surface of the semiconductor substrate 202 and extending into the drain region 214a, as shown in FIG. 9. In this embodiment, a photoresist (not illustrated) is coated on the semiconductor device 200, and a patterned photoresist is formed by performing a photolithography process. Then the patterned photoresist is used as a mask, and a trench 218 is formed in the drain region 214a by an etching process. Subsequently, an ashing process and a cleaning process are performed to remove the remaining photoresist on the semiconductor device 200. The ashing process and the clean process have the same meaning as in the preceding paragraph and will not be repeated for the sake of brevity.

Figure 10:
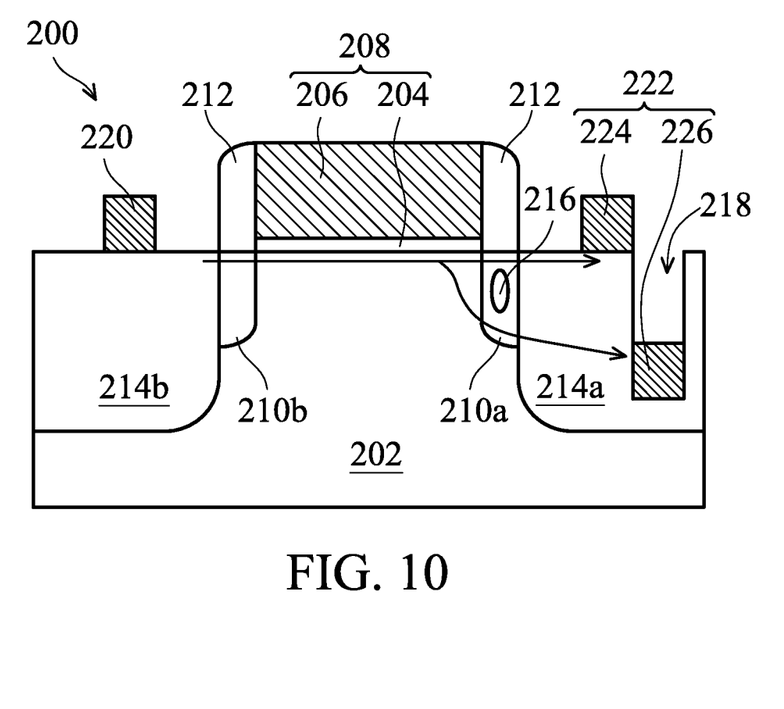
FIG. 10 illustrates a source electrode and a drain electrode formed according to an exemplary embodiment of the invention.

At 116, a source electrode 220 and a drain electrode 222 are formed, as shown in FIG. 10, wherein the drain electrode 222 includes a first portion 224 and a second portion 226. The source electrode 220 is formed on the source region 214b, a first portion 224 of the drain electrode 222 is formed on the drain region 214a and a second portion 226 of the drain electrode 222 is formed in the trench 218 by a photolithography process, a deposition process, and an etching process. In some embodiments, the top surface of the second portion 226 of the drain electrode 222 is lower than the bottom surface of the oxide region 216 but higher than the bottom surface of the lightly-doped drain region 210a.

As set forth, the oxide region 216 in the lightly-doped drain region 210a of the present invention may bypass the current flowing from the source to the drain. In addition, the first portion 224 of the drain electrode 222 on the drain region 214a and the second portion 226 of the drain electrode 222 in the trench 218 may let the bypass current bypassed by the oxide region 216 in the lightly-doped drain region 210a flow to the first portion 224 and the second portion 226 respectively to achieve the effect of bypassing the current (as the arrow shows in FIG. 10) to further prevent the HCI effect.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

Although some embodiments of the present disclosure have been described in detail, it is to be understood that the invention is not limited to the disclosed embodiments. It will be apparent to those skilled in the art that various modifications and variations can be made to the disclosed embodiments. Therefore, it is intended that the specification and examples be considered as exemplary only, with the true scope of the disclosure being indicated by the following claims and their equivalents.

What is claimed is:

1. A semiconductor device, comprising:
   a semiconductor substrate;
   a gate structure disposed on the semiconductor substrate;
   a source region and a drain region disposed on opposite sides of the gate structure on the semiconductor substrate;
   a lightly doped drain region adjacent to a side of the drain region adjacent to the gate structure;
   a lightly doped source region adjacent to a side of the source region adjacent to the gate structure;
   an oxide region disposed in the lightly doped drain region;
   a trench extending from a surface of the semiconductor substrate into the drain region;
   a source electrode disposed on the source region; and
   a drain electrode having a first portion disposed on the drain region and a second portion disposed in the trench,
   wherein a bottom surface of the second portion of the drain electrode is lower than a bottom surface of the lightly doped drain region.

2. The semiconductor device as claimed in claim 1, wherein the oxide region is fully enclosed by the lightly doped drain region.

3. The semiconductor device as claimed in claim 1, wherein a top surface of the second portion of the drain electrode is lower than a bottom surface of the oxide region, but higher than a bottom surface of the lightly doped drain region.

4. The semiconductor device as claimed in claim 1, wherein the gate structure further comprises:
   a gate dielectric layer disposed on the semiconductor substrate; and
   a gate electrode disposed on the gate dielectric layer.

5. The semiconductor device as claimed in claim 1, further comprising:
   a pair of spacers disposed on sidewalls of the gate structure, and wherein the oxide region is correspondingly disposed beneath one of the pair of spacers.

6. A method for fabricating a semiconductor device, comprising:
   providing a semiconductor substrate;
   forming a gate structure disposed on the semiconductor substrate;
   forming a source region and a drain region disposed on opposite sides of the gate structure on the semiconductor substrate;
   forming a lightly doped drain region adjacent to a side of the drain region adjacent to the gate structure;
   forming a lightly doped source region adjacent to a side of the source region adjacent to the gate structure;
   forming an oxide region disposed in the lightly doped drain region;
   forming a trench extending from a surface of the semiconductor substrate into the drain region;
   forming a source electrode disposed on the source region; and
   forming a drain electrode having a first portion disposed on the drain region and a second portion disposed in the trench, wherein a bottom surface of the second portion of the drain electrode is lower than a bottom surface of the lightly doped drain region.

7. The method as claimed in claim 6, wherein the oxide region is fully enclosed by the lightly doped drain region.

8. The method as claimed in claim 6, wherein a top surface of the second portion of the drain electrode is lower than a bottom surface of the oxide region, but higher than a bottom surface of the lightly doped drain region.

9. The method as claimed in claim 6, wherein forming the gate structure further comprises:
   forming a gate dielectric layer on the semiconductor substrate; and
   forming a gate electrode on the gate dielectric layer.

10. The method as claimed in claim 6, further comprising:
    forming a pair of spacers on sidewalls of the gate structure, wherein the oxide region is correspondingly disposed beneath one of the pair of spacers.

11. The method as claimed in claim 6, wherein forming the oxide region further comprises:
    before forming the source region and the drain region, performing an oxygen ion implantation process to the lightly doped drain region; and
    after forming the source region and the drain region, performing an annealing process so that oxygen ions in the lightly doped drain region form the oxide region.

* * * * *